United States Patent [19]

Kugou et al.

[11] Patent Number: 5,596,244
[45] Date of Patent: Jan. 21, 1997

[54] COMPOSITE ELECTRONIC COMPONENT AND METHOD OF MANUFACTURING THE SAME

[75] Inventors: Daisaku Kugou; Hiroki Kikuchi; Nobuaki Kadono; Kunikazu Nakahara, all of Toyama, Japan

[73] Assignee: Murata Manufacturing Co., Ltd., Nagaokakyo, Japan

[21] Appl. No.: 502,316

[22] Filed: Jul. 13, 1995

[30] Foreign Application Priority Data

Sep. 13, 1994 [JP] Japan .................................. 6-247138

[51] Int. Cl.⁶ ........................ H01L 41/22; H01G 4/40; H03H 9/15
[52] U.S. Cl. ................... 310/348; 310/321; 310/333; 310/340; 310/366
[58] Field of Search ................................. 310/321, 333, 310/340, 348, 366

[56] References Cited

U.S. PATENT DOCUMENTS

| | | | |
|---|---|---|---|
| 4,546,283 | 10/1985 | Adamo | 310/313 R |
| 5,345,136 | 9/1994 | Takagi et al. | 310/320 |
| 5,446,335 | 8/1995 | Hino | 310/359 |

FOREIGN PATENT DOCUMENTS

| | | | |
|---|---|---|---|
| 2292011 | 12/1987 | Japan | 310/348 |
| 63-59012 | 3/1988 | Japan | 310/348 |
| 0067908 | 3/1988 | Japan | 310/348 |
| 1-74625 | 5/1989 | Japan | H03H 9/17 |
| 0055413 | 2/1990 | Japan | 310/348 |
| 3148907 | 6/1991 | Japan | 310/366 |
| 0174812 | 7/1991 | Japan | 310/348 |
| 6-13834 | 1/1994 | Japan | H03H 9/17 |

Primary Examiner—Thomas M. Dougherty
Attorney, Agent, or Firm—Armstrong, Westerman, Hattori, McLeland & Naughton

[57] ABSTRACT

A composite electronic component including a resonator element and a capacitor element fixed together by adhesive material. The capacitor element is longer than the resonator element, so that side steps are defined on both end portions of the elements. First and second lead terminals are connected by solder with first and second capacitor electrodes located on a front surface of the capacitor element and with resonator electrodes located on side surfaces of the resonator element exposed at the side steps. A third lead terminal is connected by solder with a third capacitor electrode located on a rear surface of the capacitor element. Therefore, the thin and miniature composite electronic component adapted for a Colpitts oscillation circuit is obtained at a low cost.

10 Claims, 5 Drawing Sheets

COMPOSITE ELECTRONIC COMPONENT AND METHOD OF MANUFACTURING THE SAME

BACKGROUND OF THE INVENTION

1. Field of the Invention

The present invention relates to a composite electronic component and a method of manufacturing the same, and more particularly, it relates to a composite electronic component having a resonator element and a capacitor element, and a method of manufacturing the same.

2. Description of the Related Art

In a Colpitts oscillation circuit, a composite electronic component which is formed by uniting a resonator element, and a capacitor element as disclosed in Japanese Utility Model Laying-Open Gazette No. 1-74625 (1989), for example. In this component, the resonator element of an energy trap thickness shear vibration mode and the capacitor element are arranged in parallel, so that the peripheries thereof are sealed with protective resin. Both end portions of the resonator element are held by cup or fork-shaped holding portions which are formed on input and output lead terminals and fixed by soldering, so that electrodes formed on both surfaces of the resonator element are also electrically connected to the input and output lead terminals. On the other hand, the capacitor element is provided on both end portions of one major surface with individual electrodes which are soldered to the holding portions of the input and output lead terminals, while a counter electrode formed on the other major surface of the capacitor element is soldered to an upper end portion of a ground lead terminal.

In the composite electronic component having the aforementioned structure, the input and output lead terminals must be provided with the cup or fork-shaped holding portions for holding both end portions of the resonator element and the capacitor element thereon until the lead terminals are soldered. In this case, however, because the shapes of the input and output terminals are complicated, many processes are required for forming these terminals and the material yield is inferior, thereby increasing cost. Further, the overall thickness of the aforementioned electronic component is increased due to the holding portions of the input and output lead terminals.

In order to form the cup or fork-shaped holding portions on the input and output lead terminals, these terminals must be formed by thin metal plate. Therefore, it is difficult for an automatic inserter to perform the cut-and-clinch operation of these terminals when the component is inserted in the printed circuit board.

SUMMARY OF THE INVENTION

Accordingly, an object of the present invention is to provide a composite electronic component which can be readily connected to the lead terminals without holding portions.

Another object of the present invention is to provide a composite electronic component whose overall thickness can be decreased.

Still another object of the present invention is to provide a method which can efficiently manufacture the aforementioned composite electronic component.

In order to attain the aforementioned object, a composite electronic component according to a first aspect of the present invention comprises a resonator element, a capacitor element, and first to third lead terminals. The resonator element includes a piezoelectric substrate and first and second resonator electrodes. The first resonator electrode has a first vibrating part located on a front major surface of the substrate and a first terminal part extending from the first vibrating part to cover a first side surface of the substrate. The second resonator electrode has a second vibrating part formed on a rear major surface to be opposed to the first vibrating part and a second terminal part extending from the second vibrating part to cover a second side surface of the substrate.

The capacitor element includes a dielectric plate whose length is greater than that of the piezoelectric substrate. First and second capacitor electrodes are located on both end portions of a front major surface of the dielectric plate, and a third capacitor electrode is located on a rear major surface of the dielectric plate to be opposed to the first and second capacitor electrodes.

The rear major surface of the resonator element is fixed on the front major surface of the capacitor element with a vibration space therebetween by adhesive material, thereby defining side steps by the end portions of the capacitor element and the side surfaces of the resonator element.

The first and second lead terminals have connecting ends arranged on the side steps, and the third lead terminal has a connecting end arranged on the third capacitor electrode of the capacitor element. The connecting end of the first lead terminal is connected to the first capacitor electrode and the first terminal part of the resonator element by conductive material. The connecting end of the second lead terminal is connected to the second capacitor electrode and the second terminal part of the resonator element by conductive material. Also, the connecting end of the third lead terminal is connected to the third capacitor electrode by conductive material.

According to the first aspect of the present invention, when the capacitor element and the resonator element fixed together are inserted between the three lead terminals, the connecting ends of the first and second lead terminals are engaged with the side steps, thereby these elements are correctly positioned with respect to the lead terminals in a lateral direction. Therefore, it is not necessary to provide the lead terminals with cup or fork shaped holding portions for holding both ends of the elements. Thus, the lead terminals can be simplified in shape, thereby reducing the working cost and the material cost for producing the lead terminals.

Because the terminal parts of the resonator electrodes extend from the vibrating parts to cover the side surfaces of the resonator element, these terminal parts are certainly exposed on the side steps. When the connecting ends of the first and second lead terminals are connected by the conductive material such as solder or conductive adhesive with the capacitor electrodes on the side steps, these connecting ends are also connected with the terminal parts of the resonator element. Therefore, the resonator electrode can be reliably connected with the capacitor electrode without using conductive adhesive for fixing the resonator element on the capacitor element. In other words, the resonator element and the capacitor element can be fixed easily at a low cost by means of an ordinary insulating adhesive.

The connecting ends of the first and second lead terminals and the resonator element are laterally arranged on the capacitor element, thereby the overall thickness of the component of the present invention can be reduced as compared with the case in which the lead terminals having cup or folk-shaped holding portions are used.

The resonator element is fixed on the capacitor element, whereby the resonator element is reinforced by the capacitor element against mechanical shock. Meanwhile, the vibration space is defined between the capacitor element and the vibrating part of the resonator element, whereby the resonator element is not inhibited from vibration.

Further, the first and second lead terminals may preferably be provided with stop surfaces at inner sides of the connecting ends for stopping a third side surface perpendicular to the first and second side surfaces of the resonator element. In this case, when the united resonator and capacitor elements are inserted between the three terminals, these elements are correctly positioned by these stop surfaces with respect to the lead terminals in a longitudinal direction.

Furthermore, it is preferable to use round lead wires as the lead terminals. In this case, it is easy for the automatic inserter to cut and clinch these terminals when the component is inserted in the printed circuit board. Moreover, it is also preferable to flatten the connecting ends of the terminals so that it becomes easy to connect these connecting ends with the capacitor element, and the overall thickness of the component can be decreased.

A method according to a second aspect of the present invention is adapted to manufacture a plurality of composite electronic components each of which has a resonator element and a capacitor element.

In this method, a piezoelectric mother substrate is first provided. The mother substrate has first and second mother resonator electrodes which have first and second vibrating parts located on front and rear major surfaces opposing to each other and first and second terminal parts to cover first and second side surfaces opposing each other.

Next, a dielectric mother plate is provided. The dielectric mother plate has first and second mother capacitor electrodes located on both end portions of a front major surface, and a third mother capacitor electrode formed on a rear major surface to be opposed to the first and second mother capacitor electrodes. A length of the dielectric mother plate in a direction extending from the first mother capacitor electrode to the second mother capacitor electrode is greater than a length of the piezoelectric mother substrate in a direction extending from the first side surface to the second side surface.

Then, the rear major surface of the piezoelectric mother substrate is fixed on the front major surface of the dielectric mother plate by means of adhesive material with a vibration space therebetween, thereby obtaining a mother unit. In this mother unit, first and second side steps are defined by the front major surface of the dielectric mother plate and the first and second side surfaces of the piezoelectric mother substrate.

Then, the mother unit is cut in a single element width in a direction perpendicular to the lengthwise direction thereof, thereby obtaining a plurality of united chips each of which includes the resonator element and the capacitor element.

Then, connecting ends of first and second lead terminals are connected with the first and second capacitor electrode at the first and second side steps by means of conductive material. At the same time, the connecting ends of first and second lead terminals are also connected with the first and second terminal parts of the resonator element. A connecting end of a third lead terminal is connected with the third capacitor electrode by means of conductive material.

According to the second aspect of the present invention, the piezoelectric mother substrate and the dielectric mother plate of the mother unit are simultaneously cut into a plurality of united chips. Positioning accuracy and productivity are much improved because it is not required to bond the resonator element and the capacitor element whose sizes are both very small. Also, the resonator element is prevented from being cracked or broken when it is cut from the mother substrate because the resonator element is reinforced by the capacitor element.

The united chip consisting of the resonator element and the capacitor element is stably and correctly held by the lead terminals without holding portions because the united chip has side steps to be engaged with the connecting ends of the first and second lead terminals. Also, because the element may be connected with the lead terminals at only three points, the connecting process is simplified.

Further, it is preferable to provide a dielectric grandmother plate in order to improve productivity. This grandmother plate is provided with a plurality of front capacitor electrodes to be cut into the first and second mother capacitor electrodes, and a plurality of rear capacitor electrodes to become the third mother capacitor electrode. After a plurality of the piezoelectric mother substrates are bonded on the front surface of the grandmother plate, the grandmother plate is cut for separating each of the front capacitor electrodes into the first and second mother capacitor electrodes, thereby obtaining a plurality of mother units described in the second aspect of the present invention. The subsequent processes are identical to those described in the second aspect.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
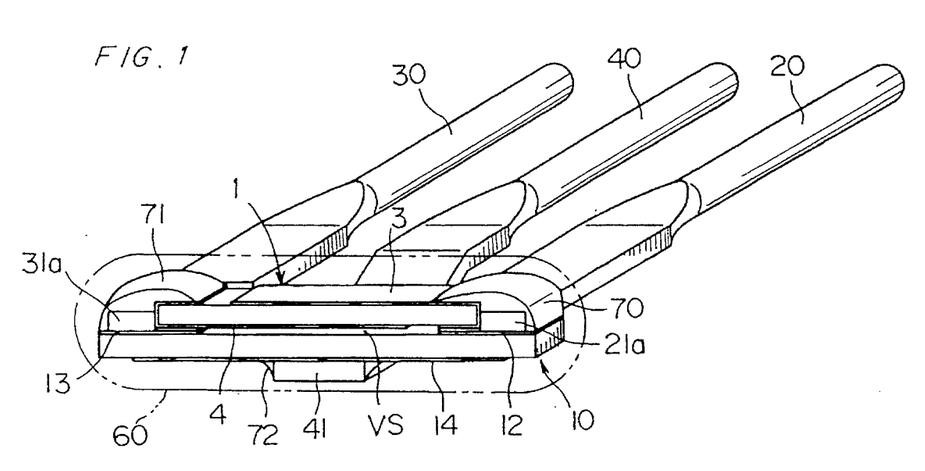
FIG. 1 is a perspective view showing a composite electronic component according to a first embodiment of the present invention.
Figure 2:
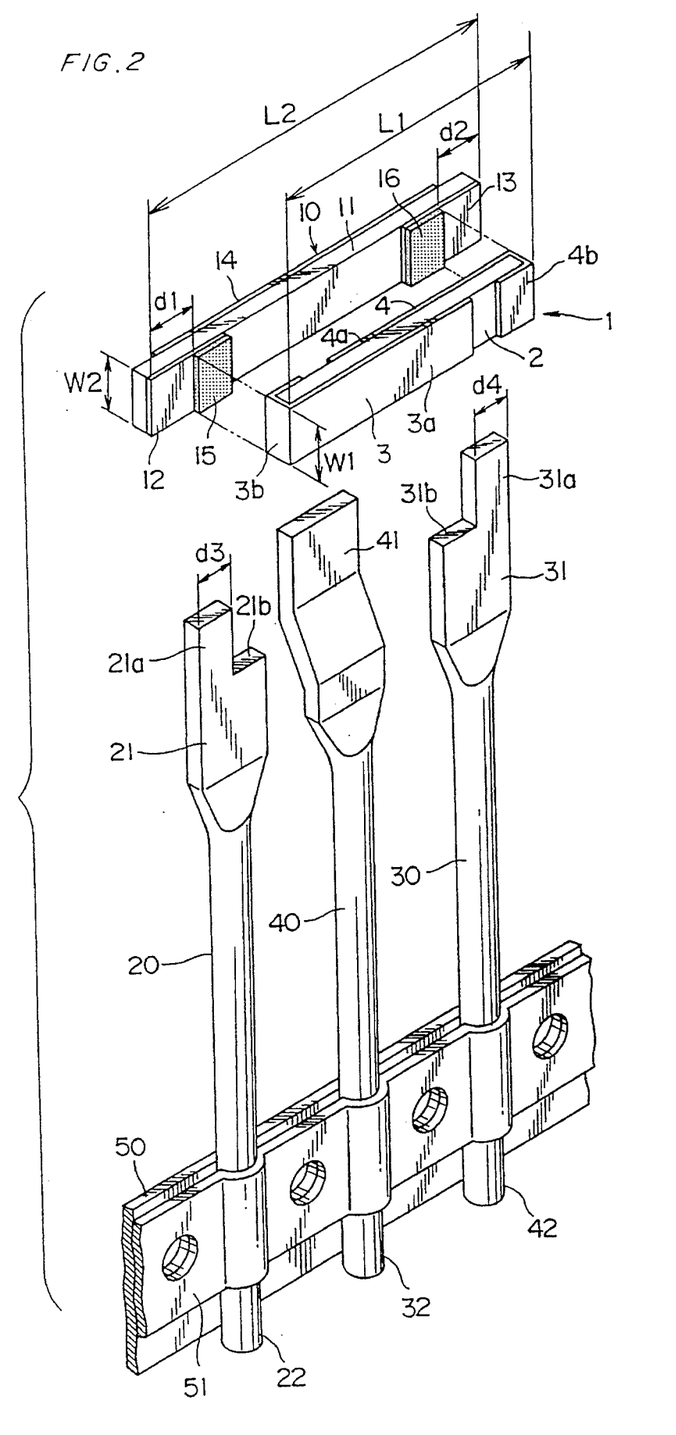
FIG. 2 is an exploded perspective view of the composite electronic component shown in FIG. 1.

FIGS. 1 and 2 show a composite electronic component applied to a Colpitts oscillation circuit according to a first embodiment of the present invention.

This component comprises a resonator element 1, a capacitor element 10 fixed with the resonator element 1 and three lead terminals 20, 30 and 40 connected to these elements 1 and 10. The peripheries of the elements 1 and 10 are sealed with protective resin member 60.

Figure 3:
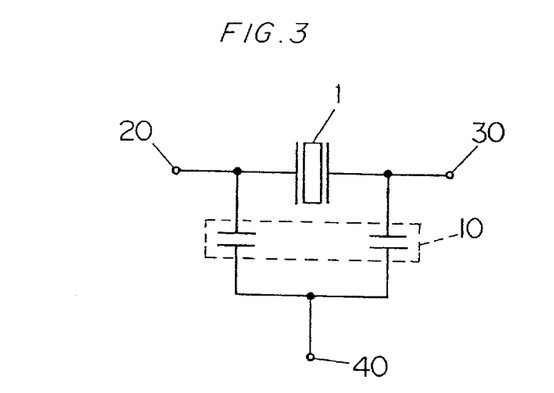
FIG. 3 is a circuit diagram of the composite electronic component shown in FIG. 1.

FIG. 3 is a circuit diagram of this component.

The element 1 is an energy-trapped piezoelectric resonator element vibrating in a thickness shear mode, and comprises a thin and elongated rectangular piezoelectric substrate 2 made of piezoelectric ceramics or a piezoelectric single crystal and resonator electrodes 3 and 4 formed on the substrate 2. The resonator electrodes 3 and 4 have vibrating parts 3a and 4a oppositely formed on central positions of the both major surfaces of the substrate 2, and have terminal parts 3b and 4b extending from the vibrating parts 3a and 4a toward opposing major surfaces via shorter side surfaces of the substrate 2 respectively.

The capacitor element 10 is formed by an elongated rectangular dielectric plate 11 which is made of a material such as glass epoxy resin or alumina ceramics, for example, having greater strength than the piezoelectric substrate 2. The length L2 of the dielectric plate 11 along a longer edge thereof is greater than the length L1 of the piezoelectric substrate 2 and the width W2 of the dielectric plate 11 along a shorter edge thereof is substantially identical to the width W1 of the piezoelectric substrate 2. According to this embodiment, the piezoelectric substrate 2 and the dielectric plate 11 have lengths L1 and L2 of 5.0 mm and 6.7 mm respectively, and widths W1 and W2 of 0.45 mm as shown in FIG. 2.

First and second capacitor electrodes 12 and 13 are formed on both ends of a front surface of the dielectric plate 11 while a third capacitor electrode 14 is formed to cover most of the overall rear surface, so that opposed portions of the electrodes 12 and 14 and the electrodes 13 and 14 define two capacitors. A rear surface of the resonator element 1 is fixed to the front surface of the capacitor element 10 by means of adhesives 15 and 16, so that a vibration space VS is defined between the capacitor element 10 and the resonator element 1 due to the thicknesses of these adhesives 15 and 16. Although ordinary insulating adhesives are used as the adhesives 15 and 16 in this embodiment, conductive adhesives may alternatively be used. By using the conductive adhesives, the electrodes 3 and 12 as well as 4 and 13 are connected with each other when the resonator element 1 and the capacitor element 10 are bonded.

The three lead terminals 20, 30 and 40 are made of round lead wires having 0.4–1.0 mm in diameter, for example, and shanks 22, 32 and 42 of the terminals 20, 30 and 40 are held by tapes 50 and 51 in a parallel manner. The lead terminals 20, 30 and 40 are provided at forward ends thereof with flattened connecting portions 21, 31 and 41. The connecting portions 21 and 31 of the input and output terminals 20 and 30 are provided with narrow ends 21a and 31a which are arranged in side steps 17 and 18 (see FIG. 6) defined by both end portions of the capacitor element 10 and those of the resonator element 1, and with L-shaped stop surfaces 21b and 31b formed inside the narrow ends 21a and 31a respectively, so that the connecting portions 21 and 31 of the input and output terminals 20 and 30 are symmetrical to each other.

The narrow end 21a of the input terminal 20 is connected to the electrodes 3b and 12 by solder member 70, and the narrow end 31a of the output terminal 30 is connected to the electrodes 4b and 13 by solder member 71. Thus, the narrow ends 21a and 31a and the resonator element 1 are located laterally on the capacitor element 10, thereby the thickness of the composite component can be reduced. Further, the terminals 20 and 30 will not sidewardly project beyond the capacitor element 10 because the widths d3, d4 of the narrow end 21a and 31a are smaller than the widths d1, d2 of the side steps 17 and 18, thereby the composite component can also be reduced in size along the longitudinal direction. On the other hand, the connecting portion 41 of the ground lead terminal 40 bent along the rear surface of the capacitor element 10 is connected to a central portion of the third capacitor electrode 14 by a solder member 72.

The peripheries of the elements 1 and 10 including the connecting portions 21, 31 and 41 of the lead terminals 20, 30 and 40 are sealed with the protective resin member 60. Before the sealing process of the resin member 60, the peripheries of the resonator element 1 (including at least its vibrating area) may be covered with an elastic member such as silicone rubber or the like.

A method of manufacturing a plurality of the composite electronic components in the aforementioned structure is now described.

Figure 4:
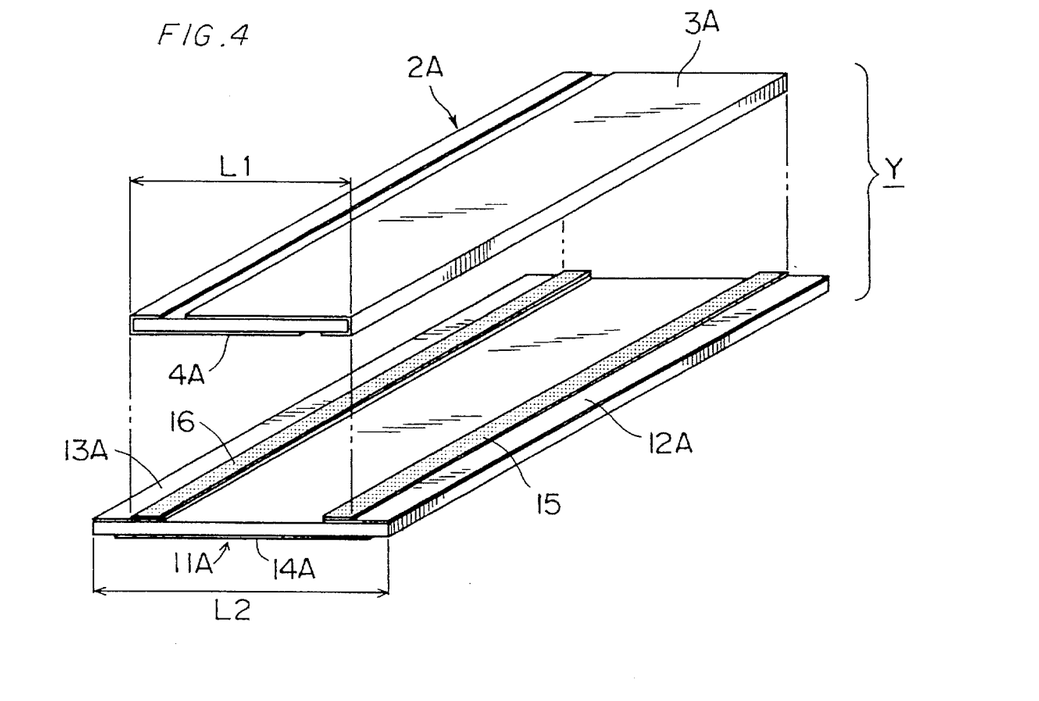
FIG. 4 is an exploded perspective view showing a mother unit formed of a piezoelectric mother substrate and a dielectric mother plate for manufacturing a plurality of the composite electronic components shown in FIG. 1.

A piezoelectric mother substrate 2A for producing the resonator elements 1 and a dielectric mother plate 11A for producing the capacitor elements 10 are prepared as shown in FIG. 4. The mother substrate 2A has a width L1 along its shorter edge direction which is identical to the length L1 of the piezoelectric substrate 2 along its longer edge direction. The mother substrate 2A is provided on both surfaces thereof with mother electrodes 3A and 4A which correspond to the resonator electrode 3 and 4 respectively. On the other hand, the mother plate 11A has a width L2 along its shorter edge direction which is identical to the length L2 of the dielectric plate 11 along its longer edge direction. The mother plate 11A is provided on the upper surface thereof with mother electrodes 12A and 13A which correspond to the capacitor electrode 12 and 13 and is provided on the lower surface thereof with a mother electrode 14A, which corresponds to the capacitor electrode 14, to be partially opposed to the mother electrodes 12A and 13A.

Figure 5:
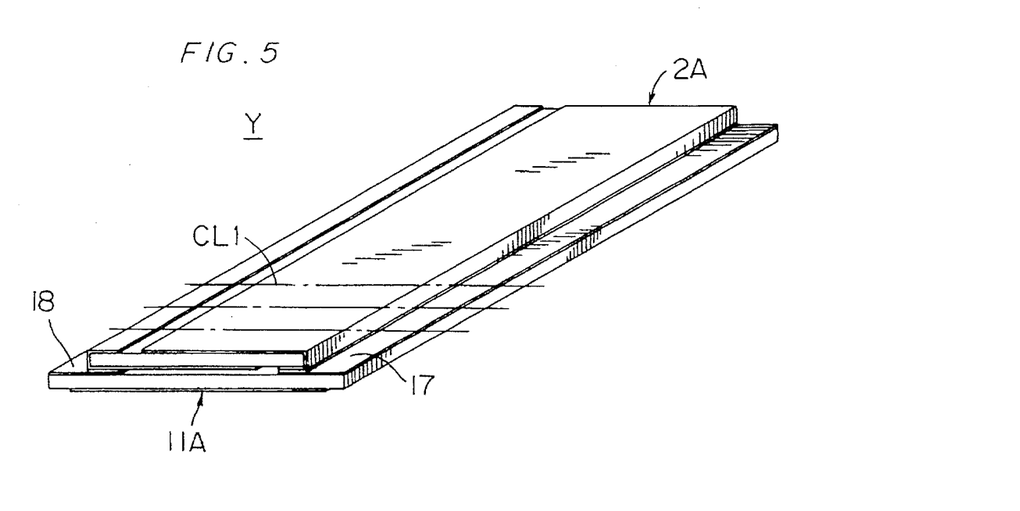
FIG. 5 is a perspective view showing the mother unit formed of the piezoelectric mother substrate and the dielectric mother plate fixed together.

Then, the mother substrate 2A is fixed on the upper surface of the mother plate 11A by means of adhesives 15 and 16 with a vibration space VS so that the both end portions of the mother substrates 2A are placed on the mother electrodes 12A and 13A of the mother plate 11A, thereby obtaining a mother unit Y as shown in FIG. 5. The adhesives 15 and 16 may be applied on the mother electrodes 12A and 13A or the lower surface of the mother substrate 2A in the form of thin films by a technique such as screen printing.

Figure 6:
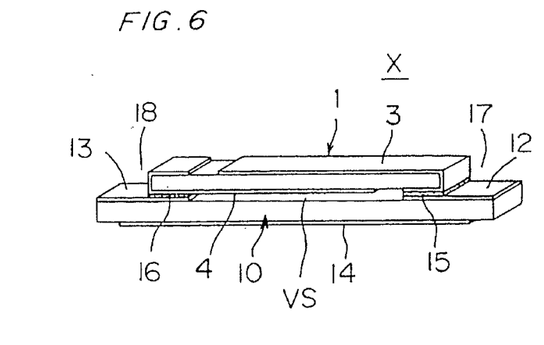
FIG. 6 is a perspective view showing a united chip which is cut out from the mother unit shown in FIG. 5.

The mother unit Y having the mother substrate 2A and the mother plate 11A fixed together are cut in a single element width (W1,W2) along the lines CL1 perpendicular to the lengthwise directions of the mother substrate 2A and the mother plate 11A as shown in FIG. 5, thereby obtaining a plurality of united chips X as shown in FIG. 6. The side steps 17 and 18 are defined at the both side ends of the united chip X by the upper surface of the capacitor element 10 and the side surfaces of the resonator element 1.

Then, the united chip X is inserted between the three lead terminals 20, 30 and 40 whose shanks 22, 32 and 42 are held by the tapes 50 and 51 shown in FIG. 2, and elastically held by the terminals 20, 30 and 40. At this time, the narrow ends 21a and 31a of the input and output terminals 20 and 30 engage with the side steps 17 and 18, while the connecting portion 41 of the ground terminal 40 comes into pressure contact with the third capacitor electrode 14 of the capacitor element 10. Further, the stop surfaces 21b and 31b of the terminals 20 and 30 support the lower surface of the resonator element 1, thereby the united chip X can be prevented from displacement.

In this holding state, the narrow end 21a of the terminal 20 is soldered to the electrodes 3 and 12 exposed at the side step 17 by the solder member 70, while the narrow end 31a of the terminal 30 is soldered to the electrodes 4 and 13 exposed at the side step 18 by the solder member 71. The connecting portion 41 of the terminal 40 is soldered to the counter electrode 14 by the solder member 72 as shown in FIG. 1. Thus, the terminals 20, 30 and 40 are mechanically coupled with and electrically connected with the resonator element 1 and the capacitor element 10.

The terminal parts 3b and 4b are necessarily exposed on the side steps 17 and 18, because the terminal parts 3b and 4b of the electrodes 3 and 4 of the resonator element 1 is extending from the vibrating parts 3a and 4a to cover the side surface. Therefore, the lead terminal 20 can reliably be connected with the capacitor electrode 12 as well as the terminal parts 3b via the solder member 70. Also, the lead terminal 30 can reliably be connected with the capacitor electrode 13 as well as the terminal parts 4b via the solder member 71.

Thereafter the peripheries of the united chip X including the connecting portions 21, 31 and 41 of the terminals 20, 30 and 40 are sealed with the protective resin member 60 by a technique such as dip coating, thereby completing manufacturing of the composite electronic component.

When the composite electronic component is inserted in the printed circuit board by means of the automatic inserter, the shank 22, 32 and 42 of the lead terminals 20, 30 and 40 are cut out from the tape 50, 51, and thereafter the shanks 22, 32 and 42 are inserted into the through holes of the printed circuit board and cut and clinched. At this time, it is easy for the automatic inserter to perform the cut-and-clinch operation because the shanks 22, 32 and 42 are formed by the round lead wires.

Figure 7:
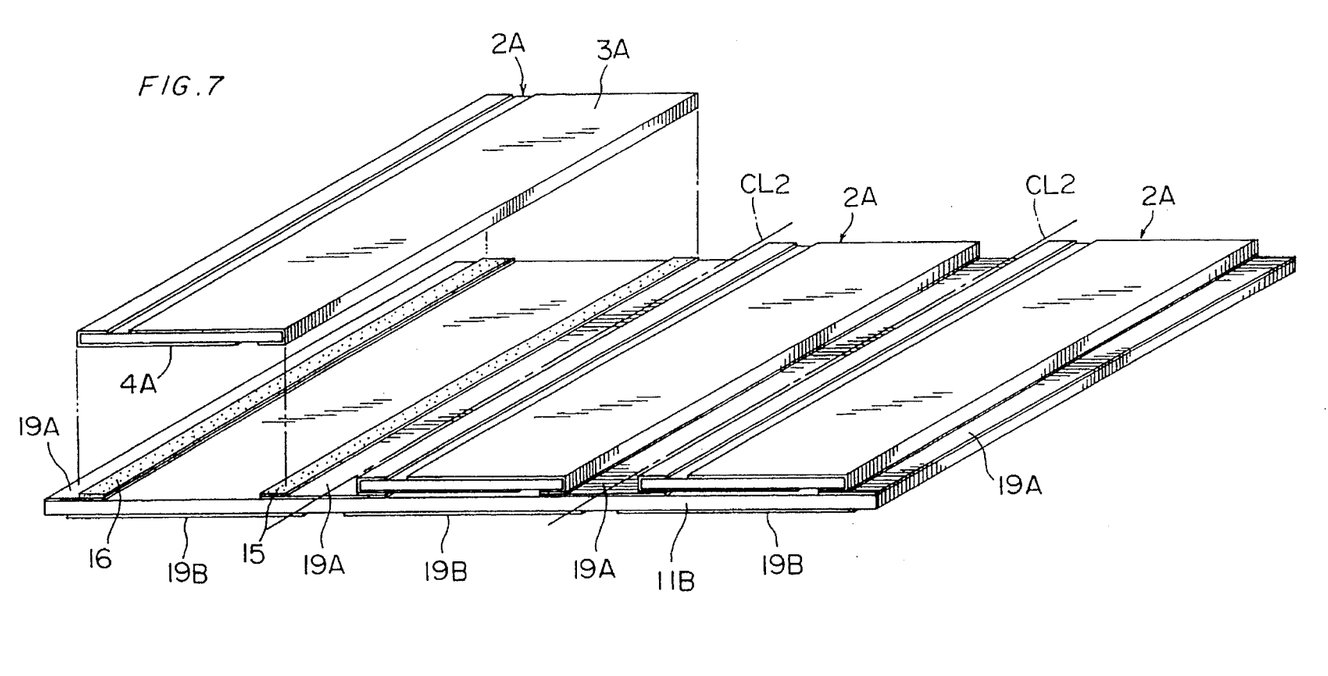
FIG. 7 is a perspective view showing a grandmother unit for manufacturing a plurality of the composite electronic components shown in FIG. 1.

FIG. 7 shows another method of manufacturing a plurality of the composite electronic components as shown in FIG. 1.

A large-sized dielectric grandmother plate 11B is provided on an upper surface thereof with a plurality of strip electrodes 19A and on a lower surface with a plurality of strip electrodes 19B to be partially opposed to the electrodes 19A.

Then, a plurality of (three in FIG. 7) piezoelectric mother substrates 2A are bonded on the upper surface of the grandmother plate 11B by adhesives 15 and 16 with vibration spaces so that the mother substrates 2A are laid across adjacent pairs of the strip electrodes 19A. The adhesives 15 and 16 may be previously applied on the strip electrodes 19A or the lower surfaces of the mother substrates 2A in the form of thin films.

The grandmother plate 11B on which the mother substrates 2A are bonded, as described above, is cut along a line CL2 to separate each of the strip electrodes 19A into two electrodes 12A and 13A, thereby obtaining a plurality of mother units Y as shown in FIG. 5.

Then, each unit Y obtained in the aforementioned manner is cut in a single element width as shown in FIG. 5, thereby obtaining a plurality of united chips X. Then the terminals are connected with the chip X, and thereafter the periphery of the chip X is sealed with the protective resin member.

The productivity of this method is more improved than that of the method described in FIGS. 4 and 5.

Figure 8:
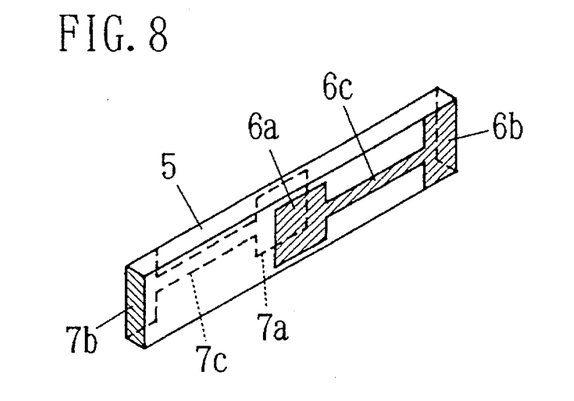
FIG. 8 is a perspective view showing a resonator element according to a second embodiment of the present invention.

The resonator element used in the present invention is not restricted to that described in the aforementioned embodiment, but it is also possible to use a resonator element having electrode patterns as shown in FIG. 8. This element has a rectangular piezoelectric substrate 5 which is provided on central positions of both major surfaces thereof with vibrating electrode parts 6a, 7a opposing each other and on the both end positions with the terminal electrode parts 6b, 7b. The vibrating electrode parts 6a, 7a and the terminal electrode parts 6b, 7b are connected with each other via thin elongated extraction electrode parts 6c, 7c respectively. The vibration mode of this embodiment is also a thickness shear mode.

Figure 9:
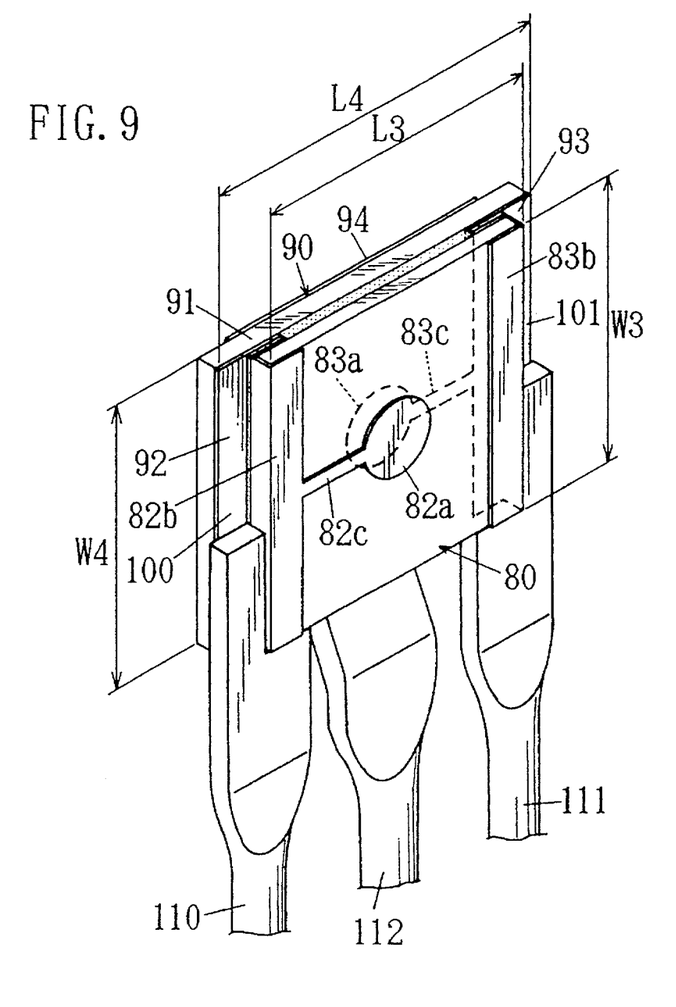
FIG. 9 is a perspective view showing a composite electronic component according to a third embodiment of the present invention.

Further, the present invention can be applied to the composite component having a resonator element 80 of a thickness expansion vibration mode and a capacitor element 90, as shown in FIG. 9. This resonator element 80 comprises a substantially square-shaped piezoelectric substrate 81, the vibrating electrode parts 82a, 83a opposing to each other on the central positions of both major surfaces of the substrate 81 and the terminal electrode parts 82b, 83b on the both end positions of the substrate 81. The vibrating electrode parts 82a, 83a are connected with the terminal electrode parts 82b, 83b via thin elongated extraction electrode parts 82c, 83c.

On the other hand, the capacitor element 90 fixed to the resonator element 80 comprises a dielectric plate 91 which has a width W4 being identical to that W3 of the substrate 81 and a length L4 being longer than that L3 of the substrate 81. The plate 91 is provided on the front surface with first and second capacitor electrodes 92 and 93, and on the rear surface with a third capacitor electrode 94 opposing the first and second capacitor electrodes 92 and 93.

First and second lead terminals 110 and 111 are arranged and soldered on the side steps 100 and 101 defined by the resonator element 80 and the capacitor element 90. Also, a third lead terminal 112 is soldered to the third capacitor electrode 94.

In this embodiment, a cavity for a vibration space may be defined between the vibrating electrode part 82a of the resonator element 80 and the protective resin member which seals the peripheries of the elements 80 and 90.

The resonator element used in the present invention is not restricted to that utilizing a thickness shear vibration mode or a thickness expansion vibration mode, but it is also possible to use a resonator element of another vibration mode.

Further, the third capacitor electrode of the capacitor element is not restricted to the electrode which is continuously formed to cover most of the overall rear surface of the dielectric plate, but the same may be separated into a plurality of portions so far as the separated electrodes serve as a common electrode in a state connected with the third lead terminal.

Although the lead terminals are formed by round lead wires in the aforementioned embodiments, the same may alternatively be formed by thin metal plates, as a matter of course. However, the lead terminals formed by round lead wires can be produced at a low cost and are suitable for the cut-and-clinch operation of the lead terminals at automatic insertion into the printed circuit board.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A composite electronic component comprising:
   a) a resonator element (1) including:
      1) a thin piezoelectric substrate (2) having from and rear major surfaces and first and second side surfaces opposing each other;
      2) a first resonator electrode (3) having a first vibrating part (3a) located on said from major surface and a first terminal part (3b) extending from said first vibrating part (3a) to cover said first side surface; and
      3) a second resonator electrode (4) having a second vibrating part (4a) located on said rear major surface opposed to said first vibrating part (3a) and a second terminal part (4b) extending from said second vibrating part (4a) to cover said second side surface;
   b) a capacitor element (10) including:
      1) a dielectric plate (11) having from and rear major surfaces;
      2) a first capacitor electrode (12) located on one end portion of said front major surface of said dielectric plate (11);
      3) a second capacitor electrode (13) located on the other end portion of said front major surface of said dielectric plate (11); and
      4) a third capacitor electrode (14) located on said rear major surface of said dielectric plate (11) to be opposed to said first and second capacitor electrodes (12, 13); wherein
      5) a length (L2) of said dielectric plate (11) in a first direction extending from an outer edge of said first capacitor electrode (12) to an outer edge of said second capacitor electrode (13) is greater than a length (L1) of said piezoelectric substrate (2) in said first direction extending from said first side surface to said second side surface;
   c) adhesive material (15,16) for fixing said rear major surface of said resonator element (1) on said front major surface of said capacitor element (1) with a vibration space (VS) therebetween to define first and second side steps (17,18) by said end portions of said capacitor element and said first and second side surfaces of said resonator element (1), respectively;
   d) a first lead terminal (20) having a connecting end (21a) arranged on said first side step (17);
   e) a second lead terminal (30) having a connecting end (31a) arranged on said second side step (18);
   f) a third lead terminal (40) having a connecting end (41) arranged on said third capacitor electrode (14); and
   g) conductive material (70,71,72) for connecting said connecting end (21a) of said first lead terminal (20) to said first capacitor electrode (12) and said first terminal part (3b) of said first resonator electrode (3), for connecting said connecting end (31a) of said second lead terminal (30) to said second capacitor electrode (13) and said second terminal part (4b) of said second resonator electrode (4), and for connecting said connecting end (41) of said third lead terminal (40) to said third capacitor electrode (14).

2. A composite electronic component in accordance with claim 1, wherein
   a width (W2) of said front major surface of said dielectric plate (11) in a second direction perpendicular to said first direction is substantially identical to a width (W1) of said front major surface of said piezoelectric substrate (2).

3. A composite electronic component in accordance with claim 1, wherein
   said first terminal part (3b) of said first resonator electrode (3) extends toward said rear major surface via said first side surface of said piezoelectric substrate (2),
   said second terminal part (4b) of said second resonator electrode (4) extends toward said front major surface via said second side surface of said piezoelectric substrate (2),
   said first terminal part (3b) is connected with said first capacitor electrode (12) by conductive adhesive (15), and
   said second terminal part (4b) is connected with said second capacitor electrode (13) by conductive adhesive (16).

4. A composite electronic component in accordance with claim 1, wherein
   said conductive material (70,71,72) is made of solder.

5. A composite electronic component in accordance with claim 1, wherein
   widths (d1, d2) of said first and second side steps (17,18) in said first direction are substantially identical to each other and are larger than those (d3, d4) of said connecting ends (21a,31a) of said first and second lead terminals (20,30).

6. A composite electronic component in accordance with claim 1, further comprising;
   protective resin (60) for covering peripheries of said resonator element (1) and said capacitor element (10).

7. A composite electronic component in accordance with claim 1, wherein
   said first and second lead terminals (20,30) are provided with stop surfaces (21b,31b) at inner sides of said connecting ends (21a,31a) thereof for stopping a third side surface perpendicular to said first and second side surfaces of said resonator element (1).

8. A composite electronic component in accordance with claim 1, wherein
   said resonator element (1) is an energy trapped element vibrating in a thickness shear mode, and wherein
   said resonator element (1) comprises an elongated rectangular piezoelectric substrate (2) extending from said first side surface to said second side surface.

9. A composite electronic component in accordance with claim 1, wherein
   said first to third lead terminals (20,30,40) are made of round lead wires.

10. A composite electronic component in accordance with claim 9, wherein
   said first to third lead terminals (20,30,40) are provided at forward ends thereof with flattened connecting ends (21,31,41) to be connected with said first to third capacitor electrodes (12,13,14).

* * * * *